US011206012B2

(12) United States Patent
Li et al.

(10) Patent No.: US 11,206,012 B2
(45) Date of Patent: Dec. 21, 2021

(54) CALIBRATING RESISTANCE FOR DATA DRIVERS

(71) Applicant: QUALCOMM Incorporated, San Diego, CA (US)

(72) Inventors: Miao Li, San Diego, CA (US); Yu Song, San Diego, CA (US); Jie Xu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/101,685

(22) Filed: Nov. 23, 2020

(65) Prior Publication Data

US 2021/0175875 A1    Jun. 10, 2021

Related U.S. Application Data

(60) Provisional application No. 62/944,835, filed on Dec. 6, 2019.

(51) Int. Cl.
  *H03K 3/012*    (2006.01)
  *G11C 11/4093*    (2006.01)
  *H03K 17/687*    (2006.01)
  *H03F 3/45*    (2006.01)

(52) U.S. Cl.
  CPC .......... *H03K 3/012* (2013.01); *G11C 11/4093* (2013.01); *H03F 3/45475* (2013.01); *H03K 17/6872* (2013.01)

(58) Field of Classification Search
  CPC ............... H03K 3/012; H03K 17/6872; G11C 11/4093; H03F 3/45475
  See application file for complete search history.

(56) References Cited

U.S. PATENT DOCUMENTS

| 7,635,990 | B1 | 12/2009 | Ren et al. |
| 8,058,924 | B1 | 11/2011 | Ren et al. |
| 9,553,569 | B1* | 1/2017 | Gorecki .................. H03M 1/38 |
| 10,963,002 | B1* | 3/2021 | Hafizi .................... H03H 11/22 |
| 2011/0309857 | A1 | 12/2011 | Flynn et al. |
| 2012/0095361 | A1* | 4/2012 | Xu ...................... H03F 3/45928 600/547 |
| 2013/0015916 | A1* | 1/2013 | Wan ........................ H03F 3/211 330/69 |
| 2014/0035549 | A1* | 2/2014 | Hafizi ...................... G05F 3/08 323/311 |

(Continued)

OTHER PUBLICATIONS

International Search Report and Written Opinion—PCT/US2020/061903—ISA/EPO—dated Mar. 1, 2021.

*Primary Examiner* — Adam D Houston
(74) *Attorney, Agent, or Firm* — Haynes and Boone, LLP

(57) ABSTRACT

A data transmitter includes: a plurality of parallel driver slices, a first slice of the plurality of parallel driver slices having a first signal generator circuit with a first transistor coupled to a data signal and in series with a second transistor coupled to a first bias signal; and a first bias circuit including a third transistor and a fourth transistor in series with a first current source, the first bias circuit further including a first operational amplifier (op amp) having a first input coupled to a first reference voltage and a second input coupled between the fourth transistor and the first current source, an output of the first op amp configured to provide the first bias signal to the second transistor and to the third transistor.

31 Claims, 8 Drawing Sheets

(56) References Cited

U.S. PATENT DOCUMENTS

| | | | |
|---|---|---|---|
| 2017/0077945 A1* | 3/2017 | Pagnanelli | H03M 3/50 |
| 2018/0102797 A1 | 4/2018 | Lim et al. | |
| 2019/0068176 A1* | 2/2019 | Chang | H03F 3/45973 |
| 2020/0106649 A1* | 4/2020 | Peng | H03F 3/19 |
| 2021/0091724 A1* | 3/2021 | Johnson | H03F 3/195 |
| 2021/0151091 A1* | 5/2021 | Jeon | G11C 7/1093 |
| 2021/0175875 A1* | 6/2021 | Li | G11C 11/4093 |
| 2021/0203290 A1* | 7/2021 | Kim | H03F 3/45076 |

* cited by examiner

CALIBRATING RESISTANCE FOR DATA DRIVERS

CROSS-REFERENCE TO RELATED APPLICATIONS

The present application claims the benefit of U.S. Provisional Patent Application No. 62/944,835, filed Dec. 6, 2019, the disclosure of which is hereby incorporated herein in its entirety.

TECHNICAL FIELD

The present application relates to transmitter (TX) side analog front-end (AFE) design, specifically, the output driver implementation.

BACKGROUND

Modern microprocessors operate on relatively large words. For example, conventionally, some processors process 64-bit words. As the processor clock rate increases more than before, the routing of such relatively wide words on the wide bit bus becomes problematic. At high transmission rates, the inevitable skew associated with propagation on separate traces on a wide bit bus may cause unacceptable bit error rates. Furthermore, such buses may require large amounts of power and may be expensive to design.

Serializer-deserializer (SerDes) systems have been developed to enable high-speed transmission of data words without the skew and distortion problems associated with high-speed wide bit buses. The SerDes transmitter serializes the data word into a high-speed serial data stream. The corresponding SerDes receiver receives the high-speed serial data stream and deserializes it into parallel data words. Serial transmission is usually differential and may include an embedded clock. Thus, the skew and distortion problems associated with high-speed wide bit data buses may be reduced.

A voltage-mode transmitter transmits an output signal by either charging or discharging an output terminal depending upon the binary value of the bit to be transmitted. To prevent reflections and other undesired effects, the voltage-mode transmitter may be impedance matched to the transmission line coupled to the output terminal. Some examples perform this impedance matching by selecting from a number of selectable slices in the voltage-mode transmitter. Each selected slice contributes to the charging and discharging of the output terminal whereas the unselected slices show high impedance to the output terminal.

In high-speed SerDes design, some drivers may calibrate output resistance in a digital way. A unit slice resistance is designed. A digital loop is running to determine how many slice numbers to use. The unit slice resistance is divided by the slice number to obtain, for example, a 50 Ohm matching resistance. In this way the slice number can vary over process, voltage, temperature (PVT) corners. Looking at a "slow-slow-slow" (SSS) corner, it may use the maximum number of slices because at this corner, the unit slice resistance is at its maximum value. Thus, the total slice number is set large enough to accommodate expected corner variations. In such driver designs, output capacitance may be large because the number of slices is large enough to cover each expected corner. In very high-speed SerDes design, bandwidth may dominate the driver performance. This may put a heavy burden on pre-driver design, in which a pre-driver may consume a large amount of power because it sends signals to each of the slices.

The unit slice resistance, Req, includes two parts: p-type metal oxide semiconductor (PMOS)/n-type metal oxide semiconductor (NMOS) Ron resistance and real resistance. Req varies over PVT corners. The number of slices is decided by a calibration loop, based on the Req value. The larger the Req value is, the larger the slice number is in use. The output signals may experience a large output capacitance due to a large number of slices. The input signals, which are from pre-driver, may also see a large gate capacitance. All this may induce bandwidth limitation.

When using a four-level pulse amplitude modulation (PAM4) design, the Most-Significant-Bit (MSB) data and Least-Significant-Bit (LSB) data may go to separate driver slices. And the ratio of MSB slice numbers to LSB slice numbers is 2:1. At each PVT corner, the calibration loop gives different slice numbers in use. The digital calibration loop may not be able to guarantee the slices can be exactly divided into ratio 2:1 over PVT corners. Thus, there may be resistance-matching resolution loss for digital calibration loops.

SUMMARY

According to one implementation, a data transmitter includes: a plurality of parallel driver slices, a first slice of the plurality of parallel driver slices having a first signal generator circuit with a first transistor coupled to a data signal and in series with a second transistor coupled to a first bias signal; and a first bias circuit including a third transistor and a fourth transistor in series with a first current source, the first bias circuit further including a first operational amplifier (op amp) having a first input coupled to a first reference voltage and a second input coupled between the fourth transistor and the first current source, an output of the first op amp configured to provide the first bias signal to the second transistor and to the third transistor.

According to one implementation, a method for operating a data transmitter circuit includes: receiving a differential data signal at a plurality of driver slices; at a first bias circuit, maintaining an output resistance of a first signal generator circuit of a first driver slice to a first resistance value, including biasing a first transistor of the first signal generator circuit; and driving the differential data signal onto a transmission line by the first signal generator circuit.

According to one implementation, a semiconductor chip includes: a driver circuit including a plurality of parallel driver slices, a first slice of the plurality of parallel driver slices having a first signal generator circuit and a second signal generator circuit; a first bias circuit replicating the first signal generator circuit, the first bias circuit coupled to a first p-type metal oxide semiconductor (PMOS) transistor of the first signal generator circuit and coupled to a second PMOS transistor of the first signal generator circuit; and a second bias circuit replicating the second signal generator circuit, the second bias circuit coupled to a first n-type metal oxide semiconductor (NMOS) transistor of the second signal generator circuit and coupled to a second NMOS transistor of the second signal generator circuit.

According to yet another implementation, a data transmitter in a semiconductor chip includes: a plurality of driver slices coupled in parallel to a serial data output, each one of the driver slices including: first means for driving a first portion of a differential data signal; and second means for driving a second portion of the differential data signal; and means for matching an output resistance of the data transmitter to a resistance of a transmission line, the matching means including: a first bias circuit replicating a first portion of the first means, the first bias circuit coupled to a first p-type metal oxide semiconductor (PMOS) transistor of the first portion of the first means and coupled to a second PMOS transistor of the first portion of the first means; and a second bias circuit replicating a second portion of the first means, the second bias circuit coupled to a first n-type metal oxide semiconductor (NMOS) transistor of the second portion of the first means and coupled to a second NMOS transistor of the second portion of the first means.

DETAILED DESCRIPTION

Figure 1:
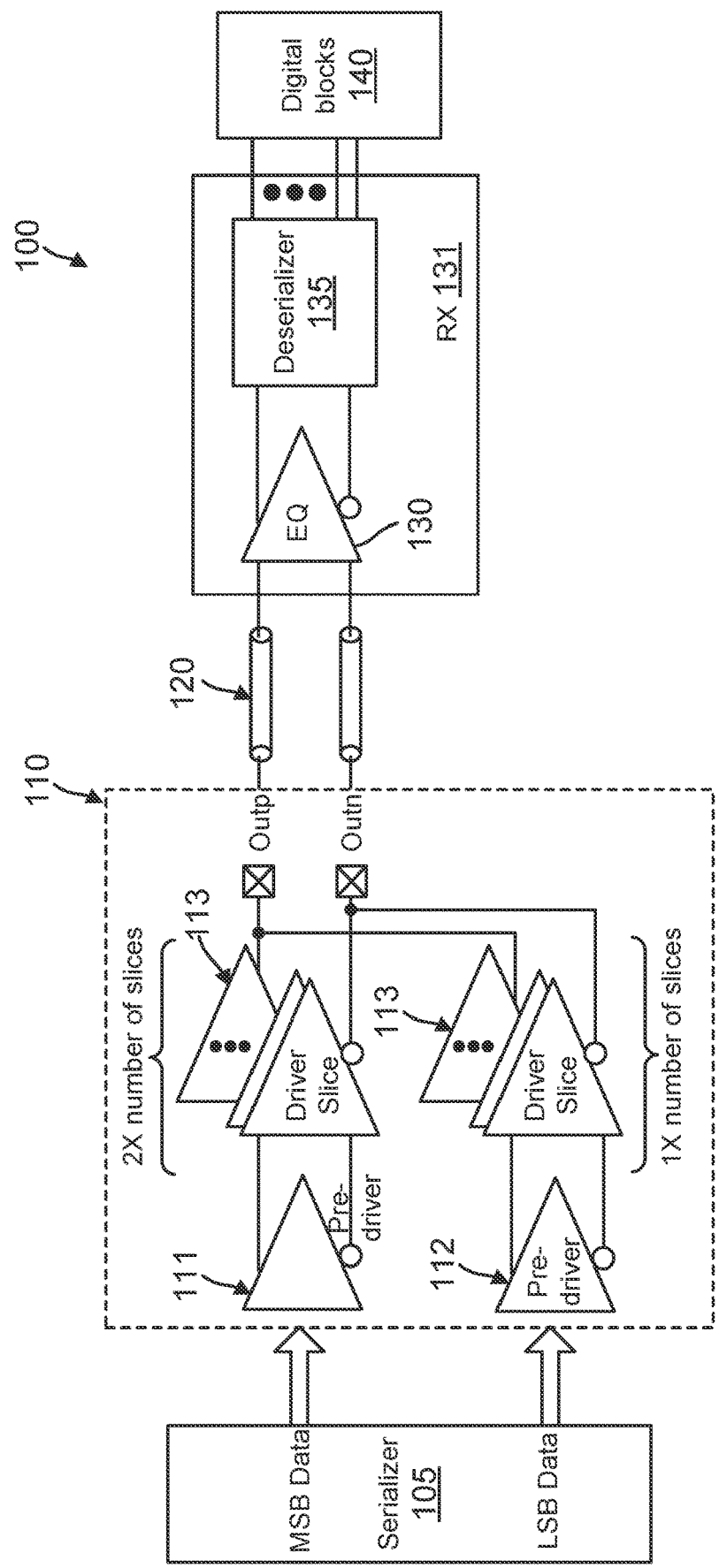
FIG. 1 is an illustration of an example data transmitting and receiving circuit, according to one implementation.

According to principles described herein, a driver circuit for a data transmitter is improved to maintain consistent performance across process, voltage, and temperature (PVT) corners. The driver circuit may be used in a transmitter (TX) side analog front-end (AFE) design. Various modulation schemes may be used for SerDes systems. One such scheme is a 56-Gb/s signaling system using a four-level pulse amplitude modulation (PAM4) format. Different from traditional calibrating on driver termination resistance, an analog technique is described herein to obtain matching resistance. According to some principles described herein the number of active driver slices is fixed over PVT corners. This is in contrast to other methods in which the number of active driver slices is digitally controlled so that different numbers of driver slices can be activated, turned on, or selected at different PVT corners.

In this example, a driver slice includes one unit of a set of identical, parallel pieces of hardware (circuits) that are used to perform the driver function. Simulations using some implementations of the circuits described herein with respect to FIGS. 1-5 are proven more robust to PVT variations, alleviating output capacitance, as well as saving power and layout routing effort in high-speed pre-driver buffer design.

According to some principles described herein, a driver slice design uses an analog method to calibrate the Req resistance of each slice to provide a desired value for driver output resistance (50 Ohms, for example). For instance, a data transmitter may include a plurality of parallel driver slices. Focusing on one slice first, it has four different signal generator circuits—two signal generator circuits associated with a p portion of the differential signal and two signal generator circuits associated with an n portion of the differential signal.

A first one of the signal generator circuits is implemented using multiple transistors and a resistor. Two of the transistors may be in parallel and coupled to a source of a transistor that receives the input data. The two transistors arranged in parallel may be maintained in their triode region, whereas the transistor that receives the input data is turned on and off according to whether the input data signal is a digital 1 or a digital 0. The resistor may be in series with the transistor that receives the data.

A bias circuit includes replica transistors of the transistors in the signal generator circuit and may also include a replica of the resistor. The bias circuit includes an operational amplifier (op amp) arranged in a feedback loop to maintain a resistance of the replica transistors and resistor at a desired level. A gate voltage of one of the replica transistors may be provided as a bias voltage to one of the parallel transistors. The other one of the parallel transistors may be maintained in its triode region by use of another bias voltage generated from a bias circuit.

Of course, that is just one signal generator circuit out of four that are included in the driver slice. Each one of the different signal generator circuits may be biased in the same or similar manner. The result is that the resistance of a given driver slice may be maintained at a desired level. Collectively, the parallel driver slices may each be maintained at the desired resistance to provide a driver output resistance that matches a resistance of the transmission line.

An advantage of some implementations is that they use a fixed number of driver slices and, thus, the number of driver slices may be chosen to provide a desired ratio between most significant bits and least significant bits for a given transmission protocol. Therefore, resolution loss that may be associated with digital loops that turn on or off some of the slices may be minimized or avoided. Another advantage of some implementations is that the number of driver slices may be chosen to balance a desired bandwidth with a parasitic capacitance associated with the number of driver slices.

Another advantage is that the number of driver slices may be chosen to either reduce a size of pre-drivers in the system or to reduce loading on the pre-drivers in the system. By contrast, some systems that might increase a number of slices enabled to operate at some PVT corners may undesirably increase a load on pre-drivers or may require larger pre-drivers at the design stage to accommodate the PVT corners.

FIG. 1 is an illustration of an example data transmitting and receiving system 100, according to one implementation. System 100 includes serializer 105, which receives data as parallel bits and outputs the data as serial bits. In this example, the serializer 105 arranges the bits into two serial streams—a stream for the most significant bits (MSBs) and a stream for the least significant bits (LSBs). The use of a MSB stream and a LSB stream may be associated with PAM4, though the scope of implementations may include any modulation technique and thus may include more or fewer streams from serializer 105.

System 100 also includes a transmitter 110, which itself includes pre-drivers 111, 112 and driver slices 113. Pre-drivers 111, 112 raise a signal level of the serial data streams to a first level that is higher than the level received from serializer 105, but lower than the level output by driver slices 113. Driver slices 113 may include a plurality of driver slices arranged in parallel. In the example of FIG. 1, the MSB data stream is received from pre-driver 111, and the LSB data stream is received from pre-driver 112. Further in this example, the number of parallel data slices associated with the MSB stream is twice the number of parallel data slices associated with the LSB stream. The 2:1 ratio may be associated with PAM4, though the scope of implementations is not limited to any particular modulation technique and, thus, different ratios may be used in different applications.

In one example, the number of parallel data slices coupled with pre-driver 111 may include fourteen, and the number of parallel data slices coupled with pre-driver 112 may include seven, thereby providing a 2:1 ratio. The scope of implementations is not limited to any number of parallel data slices. For instance, another implementation may use 36 parallel data slices total or may use 45 parallel data slices total; however, those implementations with more parallel data slices may include a larger parasitic capacitance and may use larger pre-drivers 111, 112. Various other transmitter designs may include an appropriate number of parallel data slices to balance resolution, bandwidth, pre-driver size, and other relevant factors.

Transmitter 110 has a termination resistance that matches a characteristic resistance of the transmission channel 120. The scope of implementations is not limited to any transmission channel resistance, though in the examples below, the transmission channel resistance is assumed to be 50 Ohms. Therefore, the analog resistance-setting technique for the driver slices is designed to set each of the driver slices so that a collective output resistance of the full set of driver slices in parallel is a matching 50 Ohms. Although not shown in FIG. 1, implementations described herein include bias circuits, such as those described below with respect to FIGS. 4 and 5, which use analog control loops to set a desired resistance for each of the driver slices 113. The bias circuits may be built proximate the driver slices 113 and on a same semiconductor substrate.

Transmitter 110 transmits high-speed, serialized digital data to the transmission channel 120 as a series of high and low voltage values. In this example, the signal is a differential signal having two parts (Outp and Outn).

Transmission channel 120 provides a data link between transmitter 110 and receiver 131, which includes equalizer 130 and deserializer 135. Transmission channel 120 may be embodied in any appropriate structure, for example, a cable, a metal trace on a printed circuit board, a metal wire connecting chips in a package, and the like. In FIG. 1, transmission channel 120 is shown as a transmission line in order to emphasize its similarities with transmission lines in general, including having a characteristic resistance as well as a Resistance-Capacitance (RC) time constant.

Equalizer 130 receives the transmitted data signal from transmission channel 120 and acts to reshape the received data signal, where the received data signal may be distorted due to transmission line reflections, RC attenuation, or other phenomena. Equalizer 130 is used by the system 100 to reshape the digital signal so that it is output from the equalizer 130 in a form that more closely matches the approximately square wave shape of the signal at the output of transmitter 110. After being reshaped by equalizer 130, signals go to deserializer 135, after which the serial high-speed data become parallel low speed output.

Digital circuitry 140 may include a flip-flop or other data recovery circuit to capture the values of the data signal as it appears at the data output port of the equalizer 130. Use of the equalizer circuit 132 to reshape the digital signal, including applying an appropriate gain, may reduce the risk of errors in capturing the data signal.

Figure 2:
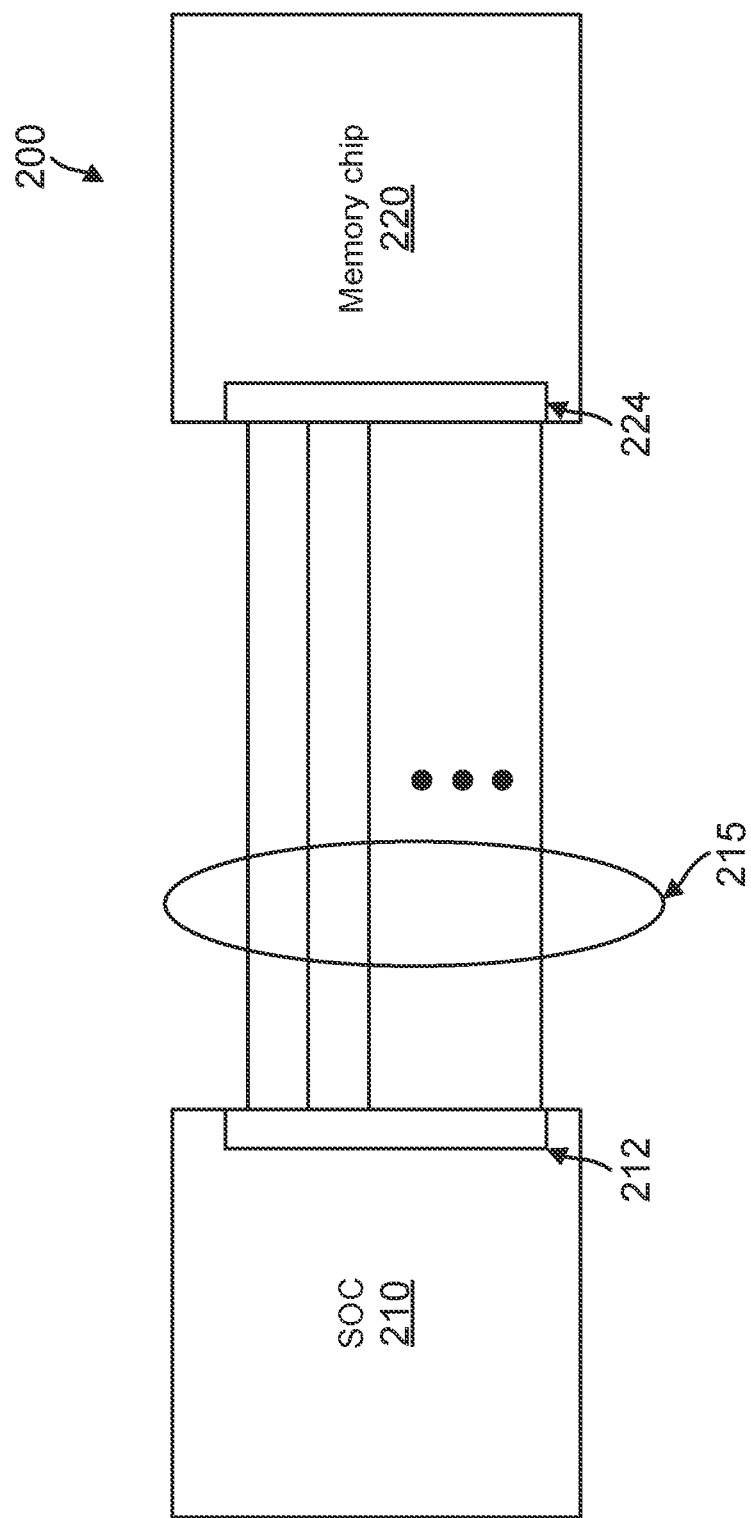
FIG. 2 is an illustration of an example chip-to-chip data transfer architecture, including multiple data transmitting and receiving circuits as in FIG. 1, according to one implementation.

FIG. 2 is an illustration of an example application of the signal transmission systems of FIGS. 1 and 3-5, according to one implementation. FIG. 2 illustrates a system 200 in which a system on a chip (SOC) 210 is in communication with a memory chip 220. SOC 210 communicates with memory chip 220 over transmission channels 215.

SOC 210 includes a multitude of processing units (not shown) implemented in a chip. The processing units may include any appropriate computing device, where examples include a mobile station modem, a multi-core central processing unit (CPU), a graphics processing unit (GPU), a digital signal processor (DSP), a 802.11x modem, and/or the like. In some examples, SOC 210 is specifically made for a mobile device, such as a smart phone, such that the cores are designed for low power consumption. However, the scope of implementations is not limited to any specific SOC architecture.

Memory chip 220 in this example includes any appropriate memory chip for use in a computing device with SOC 210. Examples include a Static Random Access Memory (SRAM) chip, a Dynamic Random Access Memory (DRAM) chip, a Synchronous Dynamic Random Access Memory (SDRAM), and an electrically erasable programmable read-only memory (Flash memory) chip, although the scope of implementations is not limited to any particular memory chip. During a write operation, memory chip 220 receives data from SOC 210 over transmission channels 215, and a memory controller at memory chip 220 then stores that data in memory cells of the memory chip. During a read operation, memory chip 220 receives a read request for specific data from SOC 210, and the memory controller of memory chip 220 then accesses the data from various memory cells of the memory chip and transmits those bits of data to the SOC 210 over transmission channels 215.

The system of FIG. 2 may include implementations of the systems shown in FIGS. 1 and 3-5. In one example, system 200 of FIG. 2 is operated according to one or more DDR standards, where memory chip 220 is a DDR SDRAM chip. Memory chip 220 includes a multitude of receiver circuits configured to receive data over respective transmission channels 215. It is expected that there would be many receivers and many transmitters at memory chip 220, so the transmitters and receivers are shown collectively at TX/RX circuit 224. Each one of the transmitter circuits operates as described above with respect to FIGS. 1 and 3-5, including having bias-controlled driver slices that operate as described with respect to method 800 of FIG. 8. Each one of the individual transmission channels 215 are the same as or similar to transmission channel 120 of FIG. 1, including having a characteristic resistance and a frequency response.

Similarly, SOC 210 also has a multitude of receiver circuits configured to receive data over respective transmission channels 215. Transmitters and receivers of SOC 210 are shown collectively in this example as TX/RX circuit 212. Each one of the receiver circuits operates as described above with respect to FIG. 1. Furthermore, the transmitter circuits in each of TX/RX circuits 212 and 224 may have a similar structure to transmitter circuit 110 of FIG. 1.

Figure 3:
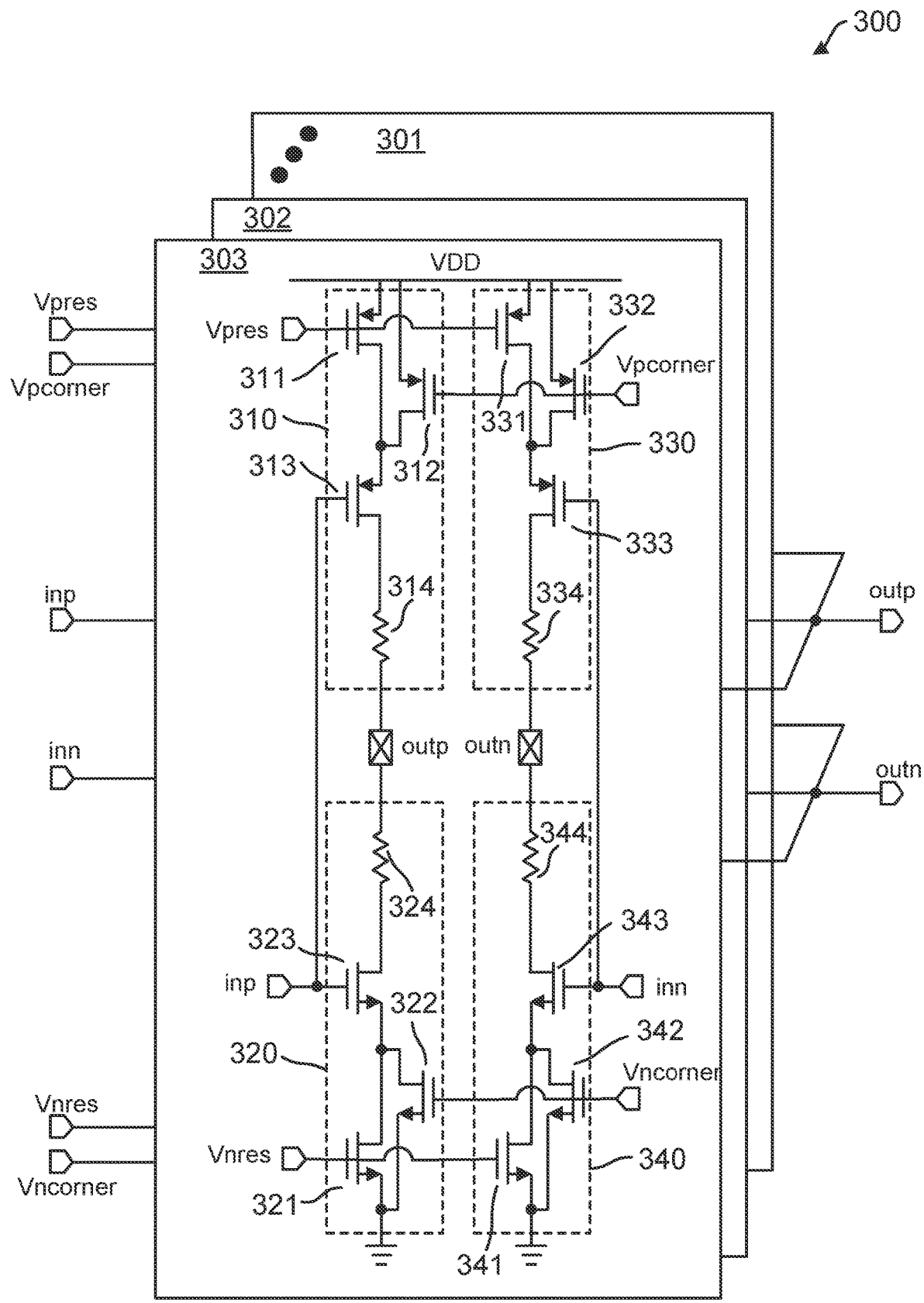
FIG. 3 is an illustration of an example driver having multiple driver slices, with one of the driver slices showing circuit structure, according to one implementation.

FIG. 3 shows an example driver 300, according to one implementation. The driver 300 includes a multitude of slices 301-303, with the circuitry of slice 303 shown in detail. It is understood that the other slices 301-302 would be implemented similarly. According to the present example, the number of slices 301-303 may be fixed, for example, at 21. In one example, the number of slices 301-303 is set to be divisible by three so that the number of slices for the MSB data can be twice the number of slices for the LSB data.

In some implementations, the unit slice resistance is fixed to a specific value, for example 1 KOhm. It is designed not to change over PVT corners. Thus, the slice number is also fixed, for example, 21. Continuing with the example, 21 slices arranged in parallel, where each slice has an output resistance of 1 KOhm, provides an output resistance for driver structure 300 at approximately 50 Ohms to match a transmission line resistance of the channel 120.

Driver slice 303 includes four signal generation circuits 310, 320, 330, 340. Signal generation circuits 310 and 320 are associated with the p portion of the differential signal, whereas signal generation circuits 330, 340 are associated with n portion of the differential signal. Looking at signal generation circuit 310 first, it includes transistors 311-313 and resistor 314. The resistance through the transistors 311-313 accounts for approximately 20-30 percent of the unit resistance value. The resistance of resistor 314 accounts for the remaining resistance of the unit resistance. Nevertheless, the scope of implementations is not limited to any particular resistance contribution from a particular component, as different designs may use different resistance contributions to accommodate expected changes from each of the components due to PVT.

Signal generation circuit 310 includes p-type metal oxide semiconductor (PMOS) devices (i.e., transistors 311-313). Similarly, signal generation circuit 330 also includes PMOS devices. By contrast, signal generation circuit 320 includes n-type metal oxide semiconductor (NMOS) devices (i.e. transistors 321-323), as does signal generation circuit 340. While signal generation circuits 310 and 320 are described in detail, it is understood that the signal generation circuits 330, 340 are implemented and operated similarly to signal generation circuits 310 and 320, respectively.

Transistors 313 and 323 receive the p portion of the differential signal (inp) from the pre-driver. When inp is low, transistor 313 turns on and transistor 323 turns off, which pulls up the signal output providing outp. When inp is high, transistor 323 turns on and transistor 313 turns off, thereby pulling the output outp pad low. The result is that the output signal outp is at a desired signal level. Signal generator circuits 330, 340 work similarly according to the n portion of the differential signal.

The bias signals, Vpres/Vnres, are generated through an analog calibration loop to adaptively tune the Ron resistance of the transistors 311, 321, 331, 341. The transistors 311, 321, 331, 341 are intended to be in the triode region. But, due to limited headroom at advanced processes, it may be difficult to guarantee that such devices will be in the triode region over various PVT corners. Accordingly, the design of FIG. 3 includes parallel transistors 312, 322, 332, 342 which are also operated in the triode region. The parallel transistors 312, 322, 332, 342 are controlled by bias signals Vpcorner/Vncorner. The bias signals Vpres/Vnres and Vpcorner/Vncorner are generated by the bias circuits described in more detail with respect to FIGS. 4 and 5.

Figure 4:
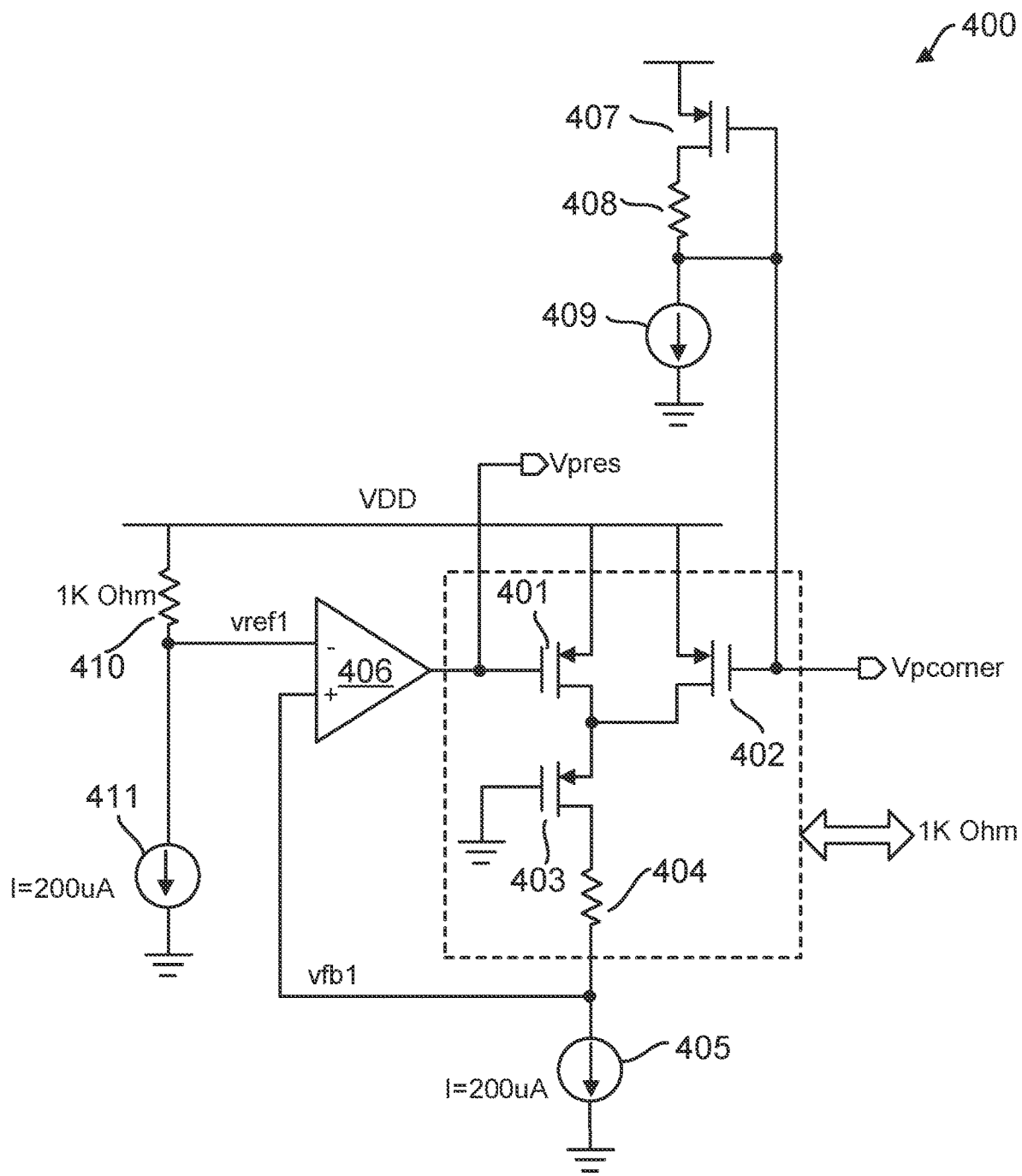
FIG. 4 is an illustration of an example bias circuit, according to one implementation.

FIG. 4 illustrates bias circuit 400, adapted according to one implementation. In this example, transistor 401 is a replica of transistors 311, 331. Transistor 402 is a replica of transistors 312, 332. Transistor 403 is a replica of transistors 313, 333. Similarly, resistor 404 is a replica of resistors 314, 324. In this example, when a transistor or a resistor is a replica of another transistor or resistor, it is built using the same processes on a same semiconductor substrate and to the same specifications. There might be some differences due to process variation affecting different parts of the semiconductor substrate differently, though it is expected that the transistors and resistors are substantially the same as they are replicas. Therefore, it is expected that they should experience similar variation over a range of voltages and temperatures during operation.

Put another way, the arrangement of transistors 401-403 and resistor 404 is designed to be a replica of signal generating circuits 310, 330. The analog tuning loop of bias circuit 400 produces Vpres/Vpcorner signals that are used to tune the unit resistances Req of the signal generating circuits 310, 330.

Op amp 406 is arranged with its inverting output receiving a reference voltage Vref1. In the example of FIG. 4, the reference voltage Vref1 is produced by a voltage drop over resistor 410 due to a current produced by current source 411. The scope of implementations is not limited to any particular technique to produce the reference voltage Vref1, as another way would include using a bandgap reference voltage or other appropriate voltage source. The other input of op amp 406 is coupled between the resistor 404 and the current source 405, and the voltage at that node represents the voltage drop due to resistor 404, transistor 403, and the parallel resistance provided by transistors 401, 402. Such a voltage drop is intended to replicate a voltage drop attributable to transistors 311-313 and resistor 314 in signal generating circuit 310 and also the voltage drop attributable to transistors 331-333 and resistor 334 of signal generating circuit 330.

The feedback loop provided by the arrangement of op amp 406 causes the voltage drop from transistors 401-403 and resistor 404 to be equal to the reference voltage Vref1. As the bias voltage Vpres increases, it causes the resistance of transistor 401 to increase, and as Vpres decreases, it causes the resistance of transistor 401 to decrease. This causes the voltage drop attributable to transistors 401-403 and resistor 404 to remain constant over PVT corners. The bias voltage Vpres is provided to the transistors 311, 331, which behave the same way. In other words, as the bias voltage Vpres increases, the resistance of transistors 311 and 331 increase, and as Vpres decreases, the resistance of transistors 311 and 331 decrease. In this way, the bias voltage Vpres causes the resistance of both signal generating circuit 310 and signal generating circuit 320 to remain constant over PVT corners as well.

As noted above, it may be difficult to keep transistor 401 within the triode region over all or substantially all of the expected PVT corners. Nevertheless, it is desirable that the combined parallel resistance of transistors 401 and 402 is within a range that can be adjusted to provide a reliable output of bias voltage Vpres. Therefore, transistor 402 is selected in accordance with transistor 407, resistor 408, and current source 409 so that transistor 402 remains in its triode region over all of the expected PVT corners. Thus, transistor 407 is a replica of transistor 402, and it is gate-coupled to transistor 402 as well. During steady-state operation, the transistor 407 is expected to remain in its triode region, thereby causing transistor 402 to also operate within its triode region. Since transistor 402 is a replica of transistors 312, 322, the bias voltage Vpcorner keeps transistors 312, 322 in their triode region.

It is noted that the present example provides specific values for resistances and currents. It is understood that such values are provided for example only, and other implementations may use different values for resistances and currents as appropriate to maintain a driver slice at a desired resistance.

Figure 5:
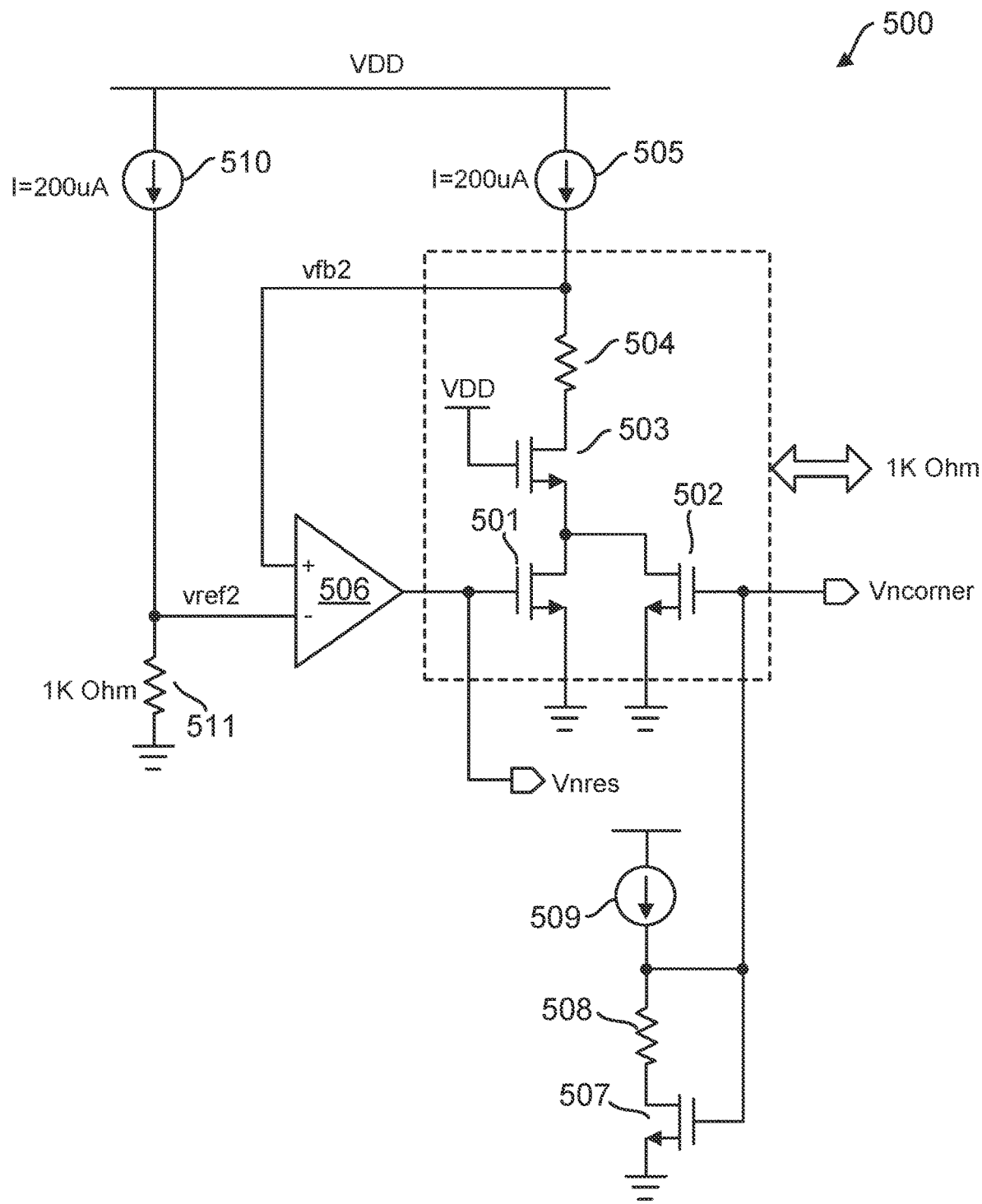
FIG. 5 is an illustration of another example bias circuit, according to one implementation.

FIG. 5 illustrates bias circuit 500, adapted according to one implementation. In this example, transistor 501 is a replica of transistors 321, 341. Transistor 502 is a replica of transistors 322, 342, and resistor 504 is a replica of resistors 324, 344. Transistor 503 is a replica of transistors 323, 343. In other words, the arrangement of transistors 501-503 and resistor 504 is designed to be a replica of signal generating circuits 320, 340. The analog tuning loop of bias circuit 500 produces Vnres/Vncorner signals that are used to tune the unit resistance Req of the signal generating circuits 320, 340.

Op amp 506 is arranged with its inverting output receiving the reference voltage Vref2, which in the example of FIG. 5 is produced by a voltage drop between current source 510 and resistor 511. However, similarly to the bias circuit of FIG. 4, the reference voltage may be produced in any appropriate manner, including being produced by a bandgap reference generator.

The other output of the op amp 506 is coupled between current source 505 and resistor 504, and the voltage difference between that node and ground represents the voltage difference attributable to resistor 324, transistor 323, and the parallel resistances 321, 322 and also the voltage difference attributable to resistor 324, transistor 343, and parallel transistors 341, 342 in the signal generating circuit 320, 340.

The feedback loop provided by the arrangement of op amp 506 causes the voltage at the node between current source 505 and resistor 504 to be equal to the reference voltage Vref2. This causes the voltage attributable to resistor 504, transistor 503, and parallel transistors 501, 502 to remain stable over PVT corners. The bias voltage Vnres is provided to the transistors 321, 341, which behave the same way. Thus, as the bias voltage Vnres decreases, the resistance of transistors 321, 341 increases, and as the bias voltage Vnres increases, the resistance of transistors 321, 341 decreases. In this way, the bias voltage Vnres causes the resistance of signal generating circuits 320, 340 to remain constant over PVT corners.

Now looking to bias voltage Vncorner, it is a gate voltage generated by the voltage at the node between the current source 509 and the resistor 508. Transistor 507 is a replica of transistor 502, and since they receive the same gate voltage, they both remain in the triode region over PVT corners. The bias voltage Vncorner is also applied to the gates of transistors 322, 342, to keep transistors 322, 342 in their triode regions as well. Just as with FIG. 4, the present example provides specific values for resistances and currents. However, those values are for example only, and other implementations may use different values for resistances and currents as appropriate to maintain a driver slice at a desired resistance.

Thus, using the bias circuits 400, 500 of FIGS. 4 and 5, the equivalent output resistance for a signal generating circuit 310, 320, 330, 340 is calibrated to a preset resistance, for example about 1000 Ohm here, through a feedback system employing op amps. Specifically, under different conditions, if the unit resistance for a signal generating circuit 310, 320, 330, 340 begins to change, the feedback loops shown in FIGS. 4 and 5 use the Vnres/Vncorner and Vpres/Vpcorner bias voltages to adjust the resistances of the transistor devices to which they connect in order to keep the unit resistance at the desired level (e.g., 1000 Ohms).

As elaborated before, in a low power supply and advanced process, it may be difficult to guarantee transistors 401, 501 stay in the triode region over PVT corners. But transistors 402, 502 are designed to be in the triode region, with their controls generated in a way as shown in FIGS. 4 and 5. Since transistors 402, 502 are parallel to transistors 401, 501, the total equivalent resistance is controllable over PVT corners.

Figure 6:
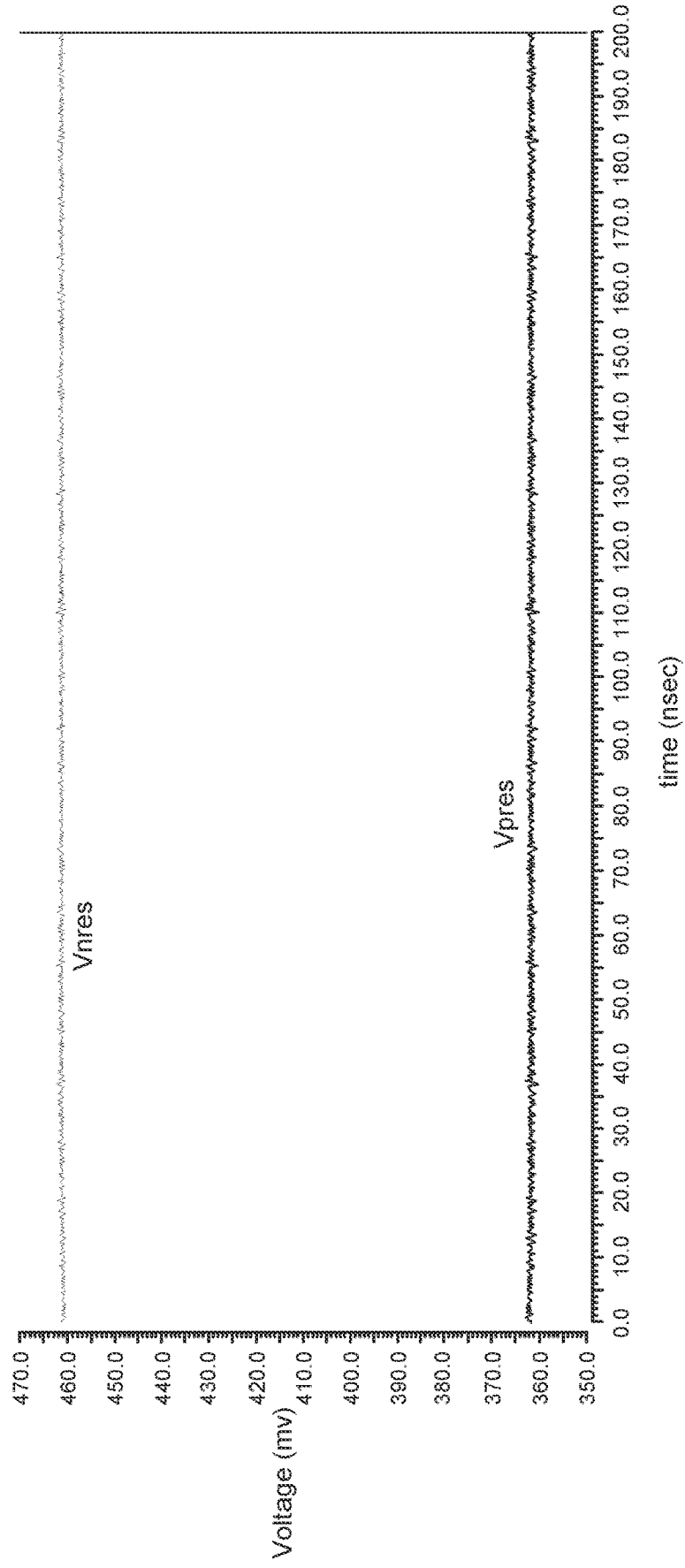
FIG. 6 is an illustration of example bias voltage levels, according to one implementation.
Figure 7:
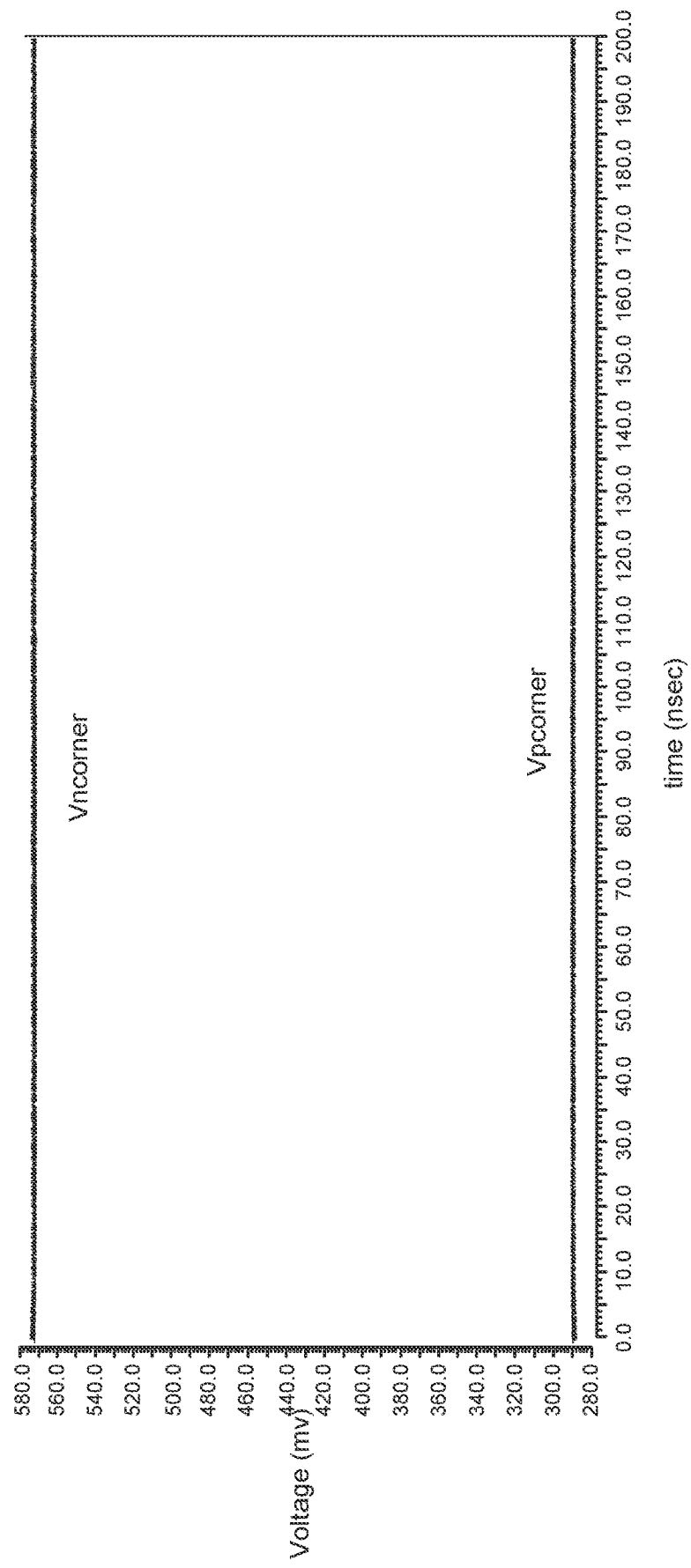
FIG. 7 is an illustration of example bias voltage levels, according to one implementation.

FIG. 6 illustrates the Vpres/Vnres signals over time in one implementation. FIG. 7 illustrates the Vpcorner/Vncorner signals over time in one implementation. As shown, they remain substantially stable in this example scenario, which is a slow-slow-slow (SSS) PVT corner, such as might be experienced due to low voltage and high temperature. Since voltage Vpres (about 360 mV) is higher than voltage Vpcorner (about 270 mV), the resistance of transistor 401 is larger than the resistance of transistor 402. However, the parallel resistance attributable to transistors 401, 402 is relatively low, as the lower resistance of transistor 402, which is still in the triode region, compensates for the larger resistance attributable to transistor 401. Also, Vncorner (about 570 mV) is somewhat larger than Vnres (about 450 mV) at this corner, so the low resistance of transistor 502, which is in its triode region, compensates for the larger resistance attributable to transistor 501.

Figure 8:
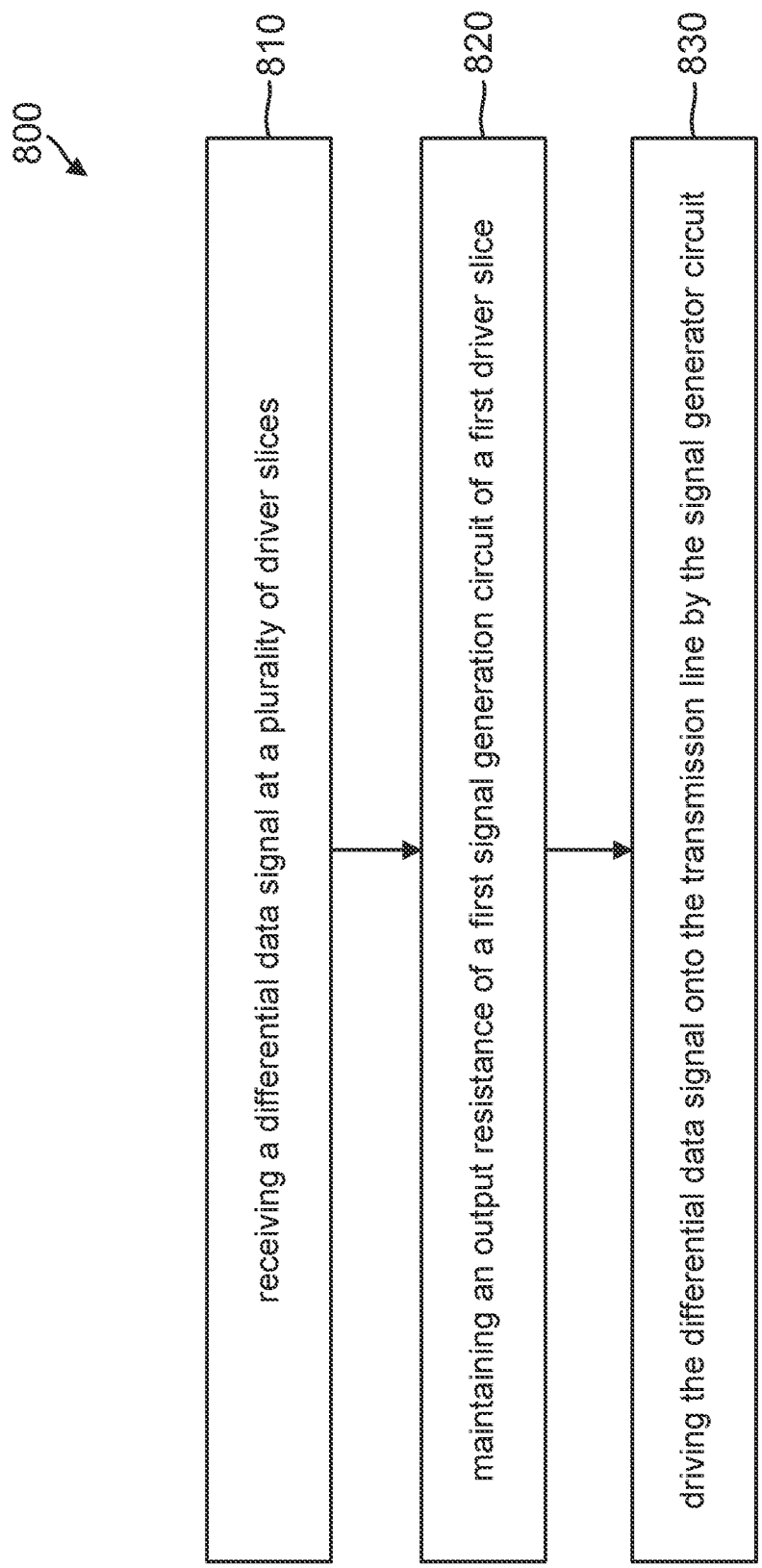
FIG. 8 is an illustration of an example method of operating a data transmitter and bias circuits, such as those discussed with respect to FIGS. 1-5, according to one implementation.

FIG. 8 is an illustration of example method 800, according to one implementation. Method 800 may be performed by the driver 300 and the bias circuits 400, 500 of FIGS. 3-5. The driver may include a plurality of slices each having a set resistance so that, in parallel, the driver slices match an impedance of the transmission line.

At action 810, a differential data signal is received at a plurality of driver slices. An example is shown in FIG. 3, in which driver 300 includes driver slices 301-303. The differential data signal has a p portion (inp) and an n portion (inn). Each of the driver slices 301-303 receives the differential signal, which is applied to gates of transistors in each of the different driver slices. For instance, FIG. 3 shows driver slice 303 receiving inp at the gates of transistors 313, 323 and receiving inn at the gates of transistors 333, 343. The various other driver slices 301-302 operate similarly.

In the example of FIG. 3, when inp is low, transistor 313 is on and transistor 323 is off, which pulls up the outp pad. When inp is low, transistor 313 is off and transistor 323 is on, which pulls down the outp pad. The signal is differential so that when inn is low, inp is high and vice versa. Further in the example of FIG. 3, when inn is low, transistor 333 is on, and transistor 343 is off, which pulls the outn pad high. When inn is high, transistor 333 is off, and transistor 343 is on, which pulls the outn pad low.

At action 820, a bias circuit maintaining an output resistance of a first signal generator circuit of a first driver slice to a first resistance value. In some instance, this may result in matching an output resistance of driver to a resistance of the transmission line. Looking at the example of FIG. 3, action 820 may include biasing transistors 311 and 331 of the signal generating circuits 310, 330. Biasing the transistors 311, 331 may operate to maintain an output resistance of the signal generating circuit to a set resistance (e.g., 1000 Ohms) to match a resistance of the transmission line (50 Ohms). Transistors 311, 331 are biased by the signal Vpres, which is generated by the bias circuit 400 of FIG. 4, as described above.

In another aspect of action 820, it may include biasing transistors 321, 341 to maintain a resistance of the signal generating circuits 320, 340 the set resistance. Transistors 321, 341 are biased by the signal Vnres, which is generated by the bias circuit 500 of FIG. 5, as described above.

Action 820 may also include adjusting a gate voltage of a transistor that is in parallel with the first transistor. For instance, in the example of FIG. 3, transistors 312, 332 are parallel to the transistors 311, 331. The transistors 312, 332 are maintained in a triode region by the bias voltage Vpcorner, as described above with respect to FIG. 4. Also, in the example of FIG. 3, transistors 322, 342 are parallel to transistors 321, 341 and are maintained in a triode region by the bias voltage Vncorner. The bias voltage Vncorner is generated as described above with respect to FIG. 5.

Action 820 may include applying bias voltages to signal generator circuits in each slice of the multi-slice driver.

At action 830, the differential signal is driven onto the transmission line by the signal generator circuit. Looking at signal generator circuit 310 first, it drives the p portion of the differential signal when the p portion is high. Signal generator circuit 320 drives the p portion of the differential signal when the p portion is low. Signal generator circuit 330 drives the n portion of the differential signal when the n portion is high, and signal generator circuit 340 drives the n portion of the differential signal when the n portion is low.

Further in the example of FIG. 3, the driver slices 301-303 are arranged in parallel so that their output pads are also arranged in parallel to generate outp and outn together. Thus, the output resistance of the driver circuit is equivalent to the slices 300-303 in parallel.

The scope of implementations is not limited to the actions shown in FIG. 8. Rather, various implementations may add, omit, rearrange, or modify actions. For instance, action 820 is performed using an analog control loop, so it is performed continuously rather than serially after action 810 or before action 830. Furthermore, actions 810 and 830 may be performed repeatedly as a multi-bit signal is transmitted during normal operation of a device.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A data transmitter comprising:
    a plurality of parallel driver slices, a first slice of the plurality of parallel driver slices having a first signal generator circuit with a first transistor coupled to a data signal and in series with a second transistor coupled to a first bias signal; and
    a first bias circuit including a third transistor and a fourth transistor in series with a first current source, the first bias circuit further including a first operational amplifier (op amp) having a first input coupled to a first reference voltage and a second input coupled between the fourth transistor and the first current source, an output of the first op amp configured to provide the first bias signal to the second transistor and to the third transistor.

2. The data transmitter of claim 1, wherein the first bias circuit further comprises a fifth transistor in parallel with the third transistor, a gate of the fifth transistor coupled to a second current source;
    wherein the first slice further comprises a sixth transistor coupled to the gate of the fifth transistor.

3. The data transmitter of claim 2, wherein the fifth transistor comprises a replica of the sixth transistor.

4. The data transmitter of claim 1, wherein the first transistor and the second transistor comprise p-type metal oxide semiconductor (PMOS) transistors.

5. The data transmitter of claim 1, wherein the third transistor comprises a replica of the second transistor.

6. The data transmitter of claim 1, wherein the fourth transistor comprises a replica of the first transistor.

7. The data transmitter of claim 1, wherein the first slice further includes:
    a second signal generator; and
    a second bias circuit including a fifth transistor and a sixth transistor in series with a second current source, the second bias circuit further including a second op amp coupled to a second reference voltage and coupled between the sixth transistor and the second current source, an output of the second op amp configured to provide a second bias signal to the second signal generator.

8. The data transmitter of claim 7, wherein the second signal generator comprises a plurality of n-type metal oxide semiconductor (NMOS) transistors.

9. The data transmitter of claim 7, wherein the first slice further comprises a second signal generator circuit, a third signal generator circuit, and a fourth signal generator circuit.

10. The data transmitter of claim 9, wherein the first signal generator circuit and the second signal generator circuit are configured to generate an n portion of the data signal, and wherein the third signal generator circuit and the fourth signal generator circuit are configured to generate a p portion of the data signal.

11. A method for operating a data transmitter circuit, the method comprising:
    receiving a differential data signal at a plurality of driver slices;
    at a first bias circuit, maintaining an output resistance of a first signal generator circuit of a first driver slice to a first resistance value, including biasing a first transistor of the first signal generator circuit; and
    driving the differential data signal onto a transmission line by the first signal generator circuit.

12. The method of claim 11, wherein biasing the first transistor comprises:
    adjusting a gate voltage of the first transistor according to a feedback loop that includes a replica of the first transistor.

13. The method of claim 11, wherein maintaining the output resistance of the first signal generator circuit comprises:
    adjusting a gate voltage of a second transistor, in parallel with the first transistor, to operate the second transistor in a triode region.

14. The method of claim 13, further comprising:
    adjusting the gate voltage to operate a third transistor in the triode region, wherein the third transistor is disposed within the first bias circuit and is a replica of the second transistor.

15. The method of claim 11, further comprising:
    at a second bias circuit, matching an output resistance of a second signal generator circuit of the first driver slice to the first resistance value, including biasing a second transistor of the second signal generator circuit, wherein the first signal generator circuit comprises a plurality of p-type metal oxide semiconductor (PMOS) devices, and wherein the second signal generator circuit comprises a plurality of n-type metal oxide semiconductor (NMOS) devices.

16. The method of claim 15, wherein the first signal generator circuit is associated with a p portion of the differential data signal, and wherein the second signal generator circuit is associated with an n portion of the differential data signal.

17. The method of claim 15, further comprising:
matching an output resistance of the data transmitter circuit to a resistance of the transmission line.

18. A semiconductor chip comprising:
a driver circuit including a plurality of parallel driver slices, a first slice of the plurality of parallel driver slices having a first signal generator circuit and a second signal generator circuit;
a first bias circuit replicating the first signal generator circuit, the first bias circuit coupled to a first p-type metal oxide semiconductor (PMOS) transistor of the first signal generator circuit and coupled to a second PMOS transistor of the first signal generator circuit; and
a second bias circuit replicating the second signal generator circuit, the second bias circuit coupled to a first n-type metal oxide semiconductor (NMOS) transistor of the second signal generator circuit and coupled to a second NMOS transistor of the second signal generator circuit.

19. The semiconductor chip of claim 18, wherein the first bias circuit is coupled to a first gate of the first PMOS transistor and to a second gate of the second PMOS transistor.

20. The semiconductor chip of claim 18, wherein the second bias circuit is coupled to a first gate of the first NMOS transistor and to a second gate of the second NMOS transistor.

21. The semiconductor chip of claim 18, wherein the first bias circuit comprises:
an operational amplifier (op amp) coupled at a first input to a reference voltage and at a second input to a feedback of the first bias circuit, an output of the op amp being gate-coupled to the first PMOS transistor.

22. The semiconductor chip of claim 18, wherein the second bias circuit comprises:
an operational amplifier (op amp) coupled at a first input to a reference voltage and at a second input to a feedback of the second bias circuit, an output of the op amp being gate-coupled to the first NMOS transistor.

23. A data transmitter in a semiconductor chip, the data transmitter comprising:
a plurality of driver slices coupled in parallel to a serial data output, each one of the driver slices including: first means for driving a first portion of a differential data signal; and second means for driving a second portion of the differential data signal; and
means for matching an output resistance of the data transmitter to a resistance of a transmission line, the matching means including:
a first bias circuit replicating a first portion of the first means, the first bias circuit coupled to a first p-type metal oxide semiconductor (PMOS) transistor of the first portion of the first means and coupled to a second PMOS transistor of the first portion of the first means; and
a second bias circuit replicating a second portion of the first means, the second bias circuit coupled to a first n-type metal oxide semiconductor (NMOS) transistor of the second portion of the first means and coupled to a second NMOS transistor of the second portion of the first means.

24. The data transmitter of claim 23, wherein the first portion of the first means is coupled to the second portion of the first means at an output pad.

25. The data transmitter of claim 23, wherein the first bias circuit replicates a first portion of the second means, and wherein the second bias circuit replicates a second portion of the second means.

26. The data transmitter of claim 23, wherein the first bias circuit comprises means for maintaining a resistance value of the first PMOS transistor to a set resistance value.

27. The data transmitter of claim 23, wherein the first bias circuit comprises means for maintaining the second PMOS transistor in a triode region.

28. The data transmitter of claim 23, wherein the second bias circuit comprises means for maintaining a resistance value of the first NMOS transistor to a set resistance value.

29. The data transmitter of claim 23, wherein the second bias circuit comprises means for maintaining the second NMOS transistor in a triode region.

30. The data transmitter of claim 23, wherein the semiconductor chip comprises a system on chip (SOC).

31. The data transmitter of claim 23, wherein the semiconductor chip comprises a memory chip.

* * * * *